United States Patent [19]

Iwase

[11] Patent Number: 5,349,561
[45] Date of Patent: Sep. 20, 1994

[54] MULTIPORT MEMORY AND METHOD OF OPERATION THEREOF

[75] Inventor: Seiichiro Iwase, Kanagawa, Japan

[73] Assignee: Sony Corporation, Tokyo, Japan

[21] Appl. No.: 722,226

[22] Filed: Jun. 27, 1991

[30] Foreign Application Priority Data

Jun. 29, 1990 [JP] Japan .................. 2-173327

[51] Int. Cl.$^5$ .................. G11C 7/00; G11C 19/00
[52] U.S. Cl. .................. 365/219; 365/220; 365/221; 365/240
[58] Field of Search ............... 365/219–221, 365/230.05, 240, 189.04

[56] References Cited

U.S. PATENT DOCUMENTS

| | | | |
|---|---|---|---|
| 4,644,502 | 2/1987 | Kawashima | 365/219 |
| 4,870,621 | 9/1989 | Nakada | 365/219 X |
| 4,891,794 | 1/1990 | Hush et al. | 365/189.04 |
| 4,947,373 | 8/1990 | Yamaguchi et al. | 365/221 X |
| 5,014,244 | 5/1991 | Lammerts et al. | 365/219 X |

FOREIGN PATENT DOCUMENTS 0171518 2/1986 European Pat. Off. .

*Primary Examiner*—Benny Lee
*Attorney, Agent, or Firm*—William S. Frommer; Alvin Sinderbrand

[57] ABSTRACT

A multiport memory having a plurality of serial output ports includes a semiconductor memory for storing data in a plurality of memory elements arrayed in rows and columns and coupled by respective row and column connecting lines. A first register stores data read in parallel from the semiconductor memory via the connecting lines of one of the rows and columns of the arrayed memory elements and serves to supply the data stored therein in serial form to a first one of the serial output ports. The first register is also operative to supply the data stored therein in parallel to a second register for storage therein. The second register is operative to supply the data stored therein to a second one of the serial output ports.

10 Claims, 5 Drawing Sheets

MULTIPORT MEMORY AND METHOD OF OPERATION THEREOF

BACKGROUND OF THE INVENTION

1. Field of the Invention

The invention relates to a multiport memory useful for image processing.

2. Description of the Prior Art

A conventional semiconductor memory will be described with reference to FIG. 1. A row of a memory 1 of (M columns×N rows) elements is selected by the output of a decoder (DEC) 2 corresponding to the upper bits AU of an address. Connecting lines of the columns of the memory 1 are connected to a selector (SEL) 5, and under the control of the selector 5 responsive to lower bits AL of the address, read data DO is provided from the selector 5. The upper bits AU are $\log_2 N$ bits, and the lower bits AL are $\log_2 M$ bits. FIG. 1 shows only the read-out elements for simplicity.

Recently, dual port memory or a video memory suited for processing a video signal in the data sequence of raster scanning has been proposed. As shown in FIG. 2, this type of memory 1 has a port for serial output data SO. Clearly, only a row address AU is given to the decoder (DEC) 2, so that the data of one row is serially output by a shift register (SAM) 6, and the serial output into the shift register 6 in a parallel fashion, and output at an independent speed of the serial port.

The port for the output data DO of FIG. 1 is called a random access port, and the port for the output data SO of FIG. 2 is called a serial port. A memory in which both such ports are provided is called a dual port memory or video memory.

The dual port memory is useful in an image processing circuit. There is a case where plural serial ports are needed. Conventionally, in FIG. 2, it is possible to have two serial ports by providing another shift register 6' at a position indicated by a broken line therein. However, the provision of 3 or more serial ports is difficult.

3. Description of Related Art

For the provision of three serial ports as shown in FIG. 3, it is considered that shift registers SR1, SR2, and SR3 are connected in parallel to the column connecting lines of the memory 1 and serial outputs SO1, SO2, and SO3 are supplied from the respective shift registers. Shift clocks SCK1, SCK2, and SCK3 are supplied to the shift registers SR1, SR2, and SR3, and parallel load signals LD1, LD2, and LD3 are supplied from a control circuit (C) 4. In addition, upper bits AU1, AU2, and AU3 of addresses corresponding to the respective ports are supplied to the selector 3 selector (SEL) 3 for application to the decoder (DEC) 2, and one of these upper bits is selected by a control signal from the control circuit 4.

For instance, in response to the selection of the upper bits AU1 by the selector 3, the load signal LD1 is fed to the shift register SR1. As a result, row data accessed by the AU1 bit loaded in parallel to the shift register SR1. The data of the shift register SR1 is output as the serial data SO1 with the shift clock SCK1.

In the structure shown in FIG. 3, there is a need that the column connecting lines drive the three shift registers SR1, SR2, and SR3, and the load consequently becomes large as compared with that of only one shift register. A powerful driver (buffer circuit) has a large area as represented in FIG. 4A. In addition, as shown in FIG. 4B or FIG. 4C, it is possible to employ one middle-class driver and three drivers to enable the increase of drive capability. However, in any one of the structures shown in FIG. 4, the circuit size becomes large making it difficult to incorporate into the memory 1. As a result, the realization of a multiport memory having many serial ports is not achieved.

OBJECTS AND SUMMARY OF THE INVENTION

It is an object of the invention, therefore, to provide a multiport memory having a number of serial ports.

According to an aspect of the present invention, there is provided a multiport memory which comprises:

first P-stage registers connected to connecting lines of one of rows or columns of a semiconductor memory;

second registers respectively connected to the outputs of the first P-stage registers and permitting a serial shift;

ports respectively provided at serial terminals of the second registers; and control means for performing a control to give addresses corresponding to the ports to the other of the rows or columns selectively, a control for parallel load into the first registers or the second registers and a control for a shift operation for the first registers.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

Figure 1:
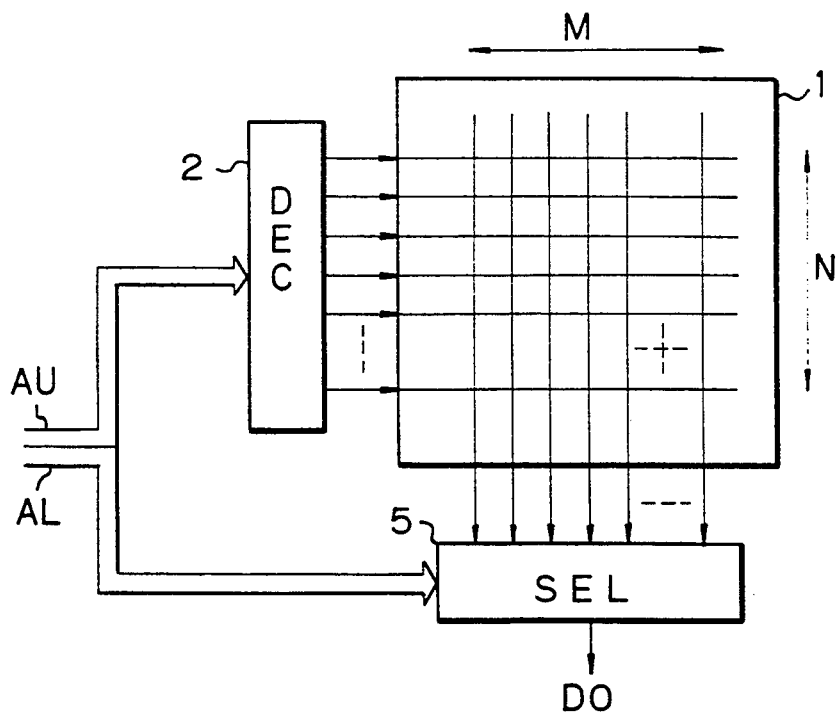
FIG. 1 is a block diagram of a conventional semiconductor memory.
Figure 2:
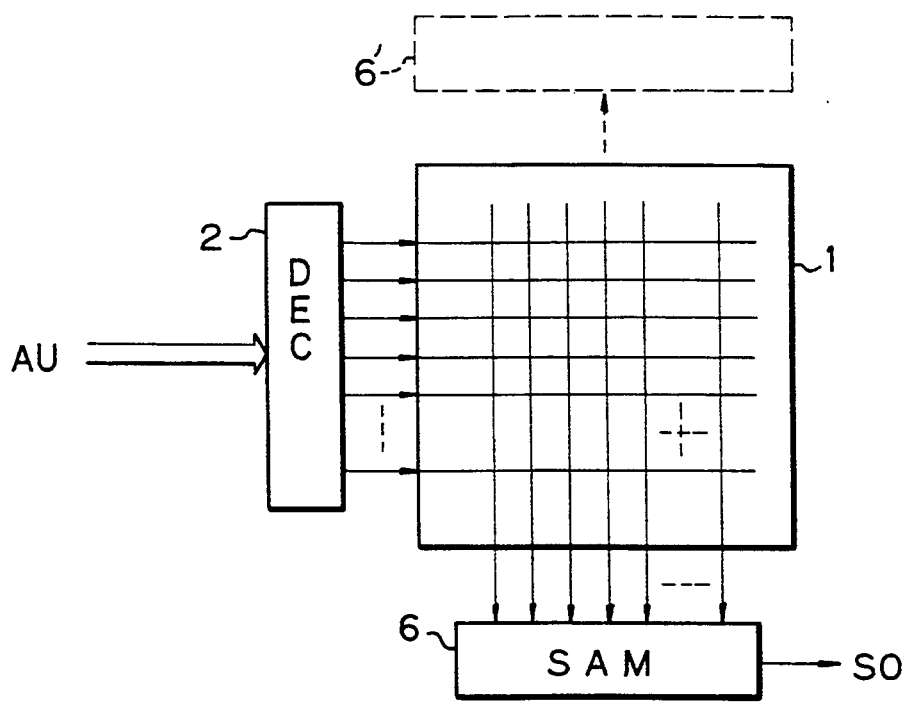
FIG. 2 is a block diagram of a dual port memory.
Figure 3:
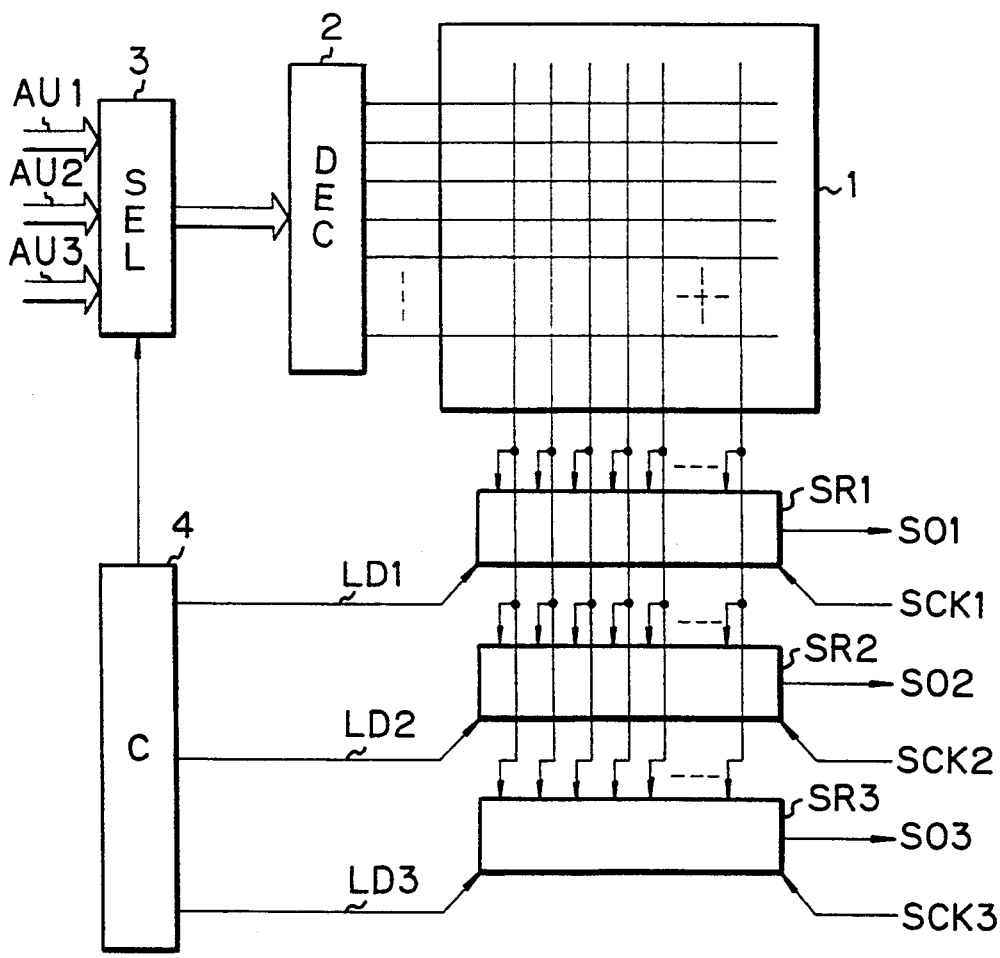
FIG. 3 is a block diagram of a multiport memory referred to in explaining the background this invention.
Figures 4A, 4B, 4C:
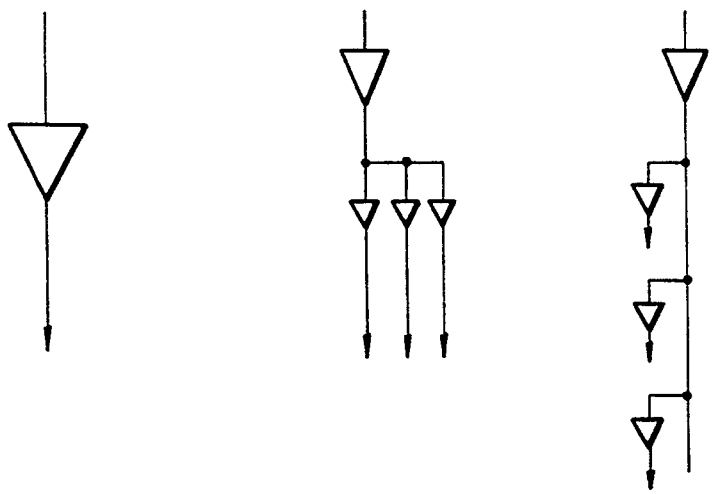
FIGS. 4A, 4B and 4C are block diagrams used for explaining a problem inherent in the structure of FIG. 3.
Figure 5:
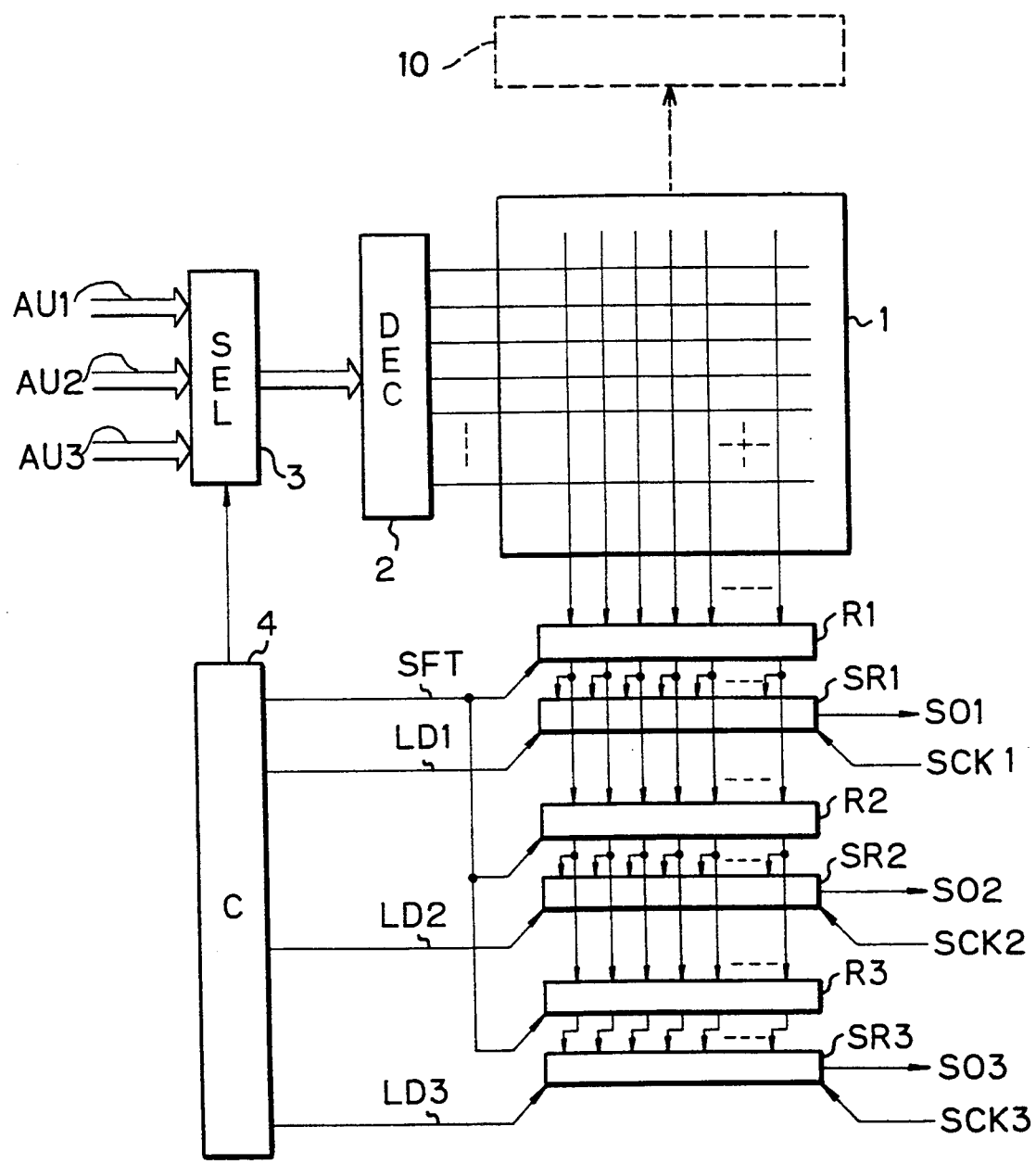
FIG. 5 is a block diagram of one embodiment of this invention.
Figure 6:
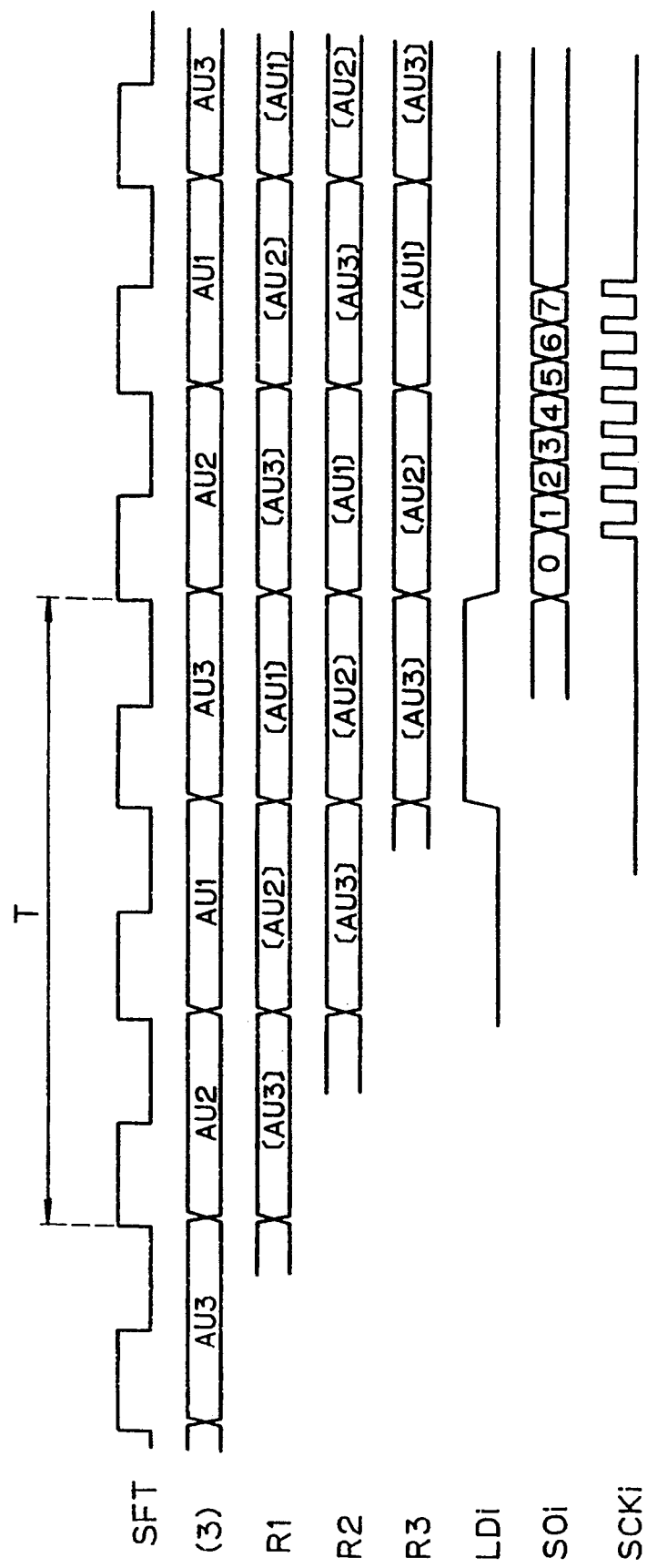
FIG. 6 is a timing chart for the embodiment of FIG. 5.

A first embodiment of this invention will be described with reference to the drawings. FIG. 5 shows the structure of the first embodiment, and FIG. 6 is a timing chart for explaining the operation thereof. In FIG. 5, a semiconductor memory 1 includes elements arranged in a matrix of (N rows×M columns, where M and N are integers). A row of the memory 1 is selected by the output of a decoder (DEC) 2. For simplicity, the illustrated embodiment is limited to the structure and operation required only for read-out. Also, a random access port 10 is illustrated in the drawing in broken lines.

Upper bits of an address selected at a selector (SEL) 3 are supplied to the decoder 2. For example, three upper bits AU1, AU2, and AU3 are given to the selector 3. The bit number of each of the upper bits is $\log_2 N$ bits. The selector 3 is controlled by a control signal from a control circuit (C) 4.

M connecting lines of the memory 1 from which one row of read data is supplied are connected to input terminals of a register R1. Input terminals of a register R2 are connected to M output terminals of the register R1. Input terminals of a register R3 are connected to M output terminals of the register R2. A shift clock SFT is provided to these registers R1, R2 and R3 for vertically shift data therebetween. Parallel input terminals of shift registers SR1, SR2, and SR3 are connected to the output terminals of the registers R1, R2, and R3, respectively.

Parallel load signals LD1, LD2, and LD3 (represented collectively as LDi in FIG. 6) are supplied to the shift registers SR1, SR2, and SR3, respectively from the control circuit 4. The outputs of the registers are loaded into the respective shift registers at the timing of the parallel load signals. The shift clocks SCK1, SCK2 and SCK3 are supplied to the shift registers SR1, SR2, and SR3, respectively, and the contents of the shift registers are produced as serial outputs SO1, SO2, and SO3 (represented collectively as the data 0 through 7 designated SOi in FIG. 6) by the shift clocks. The shift clocks SCK1, SCK2, and SCK3 (represented collectively as SCKi in FIG. 6) have a higher operating frequency as compared with the access operation for the memory 1. In this example, assuming that the access time of the memory 1 is T/3, the clock period is selected at (T/3). T is the operation cycle of this multi-port memory (See FIG. 6). This clock is used not only as the clock for the control circuit 4 but also as the shift clocks for the registers R1, R2, and R3.

As shown in the timing chart of FIG. 6, in the above-described first embodiment, upper bits of an address are selected by a control signal from the control circuit 4 at the selector 3 in descending order (i.e., in the order AU3, AU2, and AU1), as indicated in line (3) of FIG. 6. Thereupon, the shift clock SFT is generated from the control circuit 4 so that the registers R1, R2 and R3 are shifted sequentially. The registers R1, R2, and R3 operate similarly to the shift registers. Upon completion of three rows access, the contents of the registers R1, R2 and R3 are loaded into the shift registers SR1, SR2, and SR3 in a parallel manner. In FIG. 6, [AU1], [AU2] and [AU3] represent data which had been written into the addresses AU1, AU2, and AU3. The contents of the shift registers SR1, SR2, and SR3 are output as the serial outputs SO1, SO2 and SO3. In FIG. 6, the shift clocks are supplied to the shift registers SR1, SR2 and SR3, and, for instance, 8 bits of data [AU1], [AU2] and [AU3] are output.

The control of the control circuit 4 repetitiously generates control signals in a predetermined sequence. In that case, the parallel load signals LD1, LD2, and LD3 are not output selectively to the ports for which access is not needed.

In this embodiment, only one load for each port is permitted during P cycles where P is the number of the serial ports. However, if P is not a large number generally and if access to the serial ports is done in succession to some degree, such restriction does not matter. Since the continuity of the access is strong in image processing, the influence of the restriction on access is minor. For example, when ten serial ports are provided using a 10 kilobit capacity memory 1 wherein (M=100 bits, N=100 bits), 100 bits of data are outputted serially from each port, and free access to each port is substantially possible even in the use of 10 ports.

A layout where the registers and shift registers are disposed not only on the lower side of the memory 1 in FIG. 5 but also on the upper side may be employed.

Figure 7:
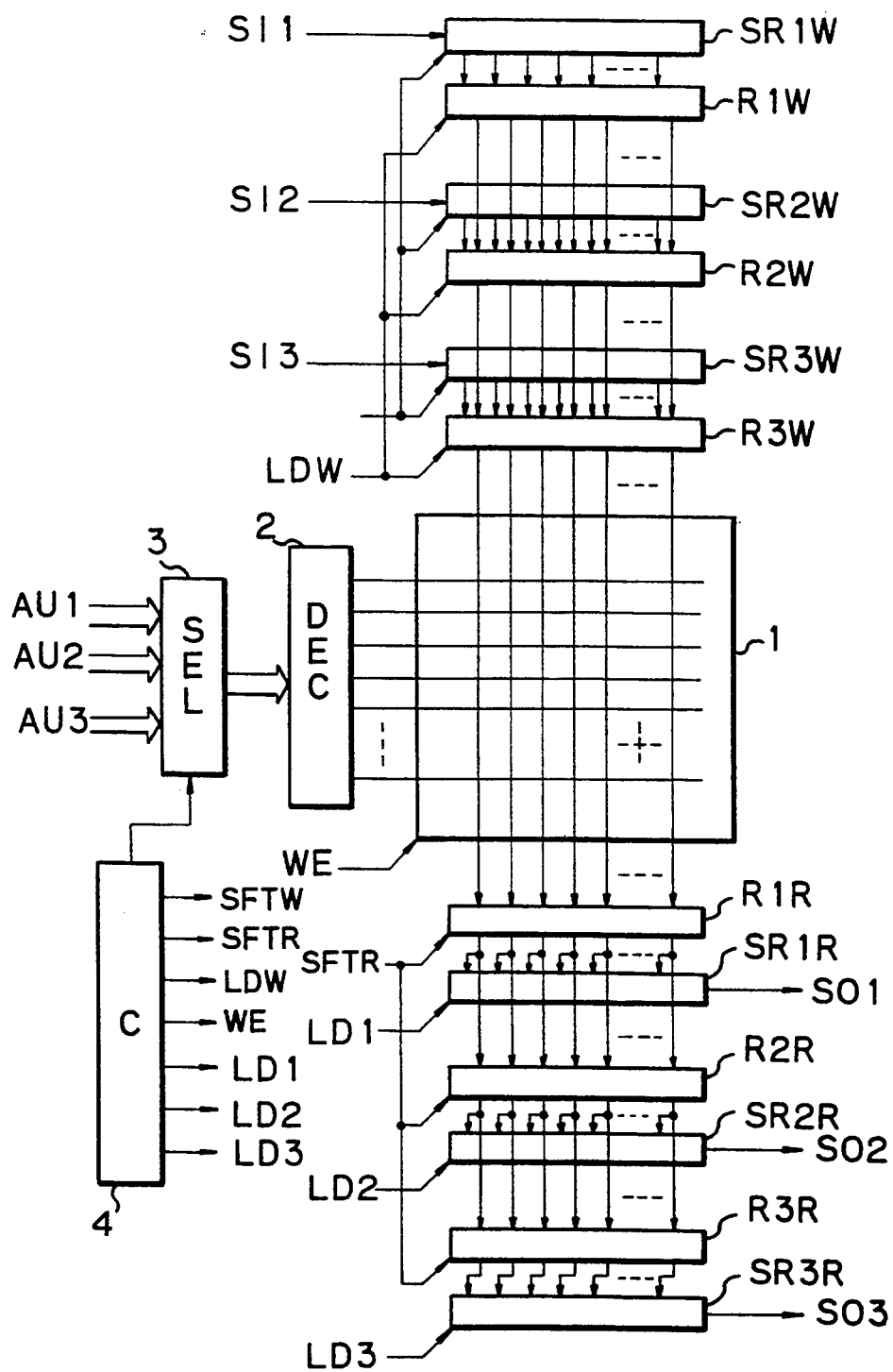
FIG. 7 is a block diagram of another embodiment of the invention.

FIG. 7 shows another embodiment of the invention wherein reference labels corresponding to reference labels shown in either FIG. 5 or FIG. 6 identify the same features. Below the memory 1 as illustrated in FIG. 7, the M connecting lines thereof are connected to registers R1R, R2R, and R3R in the same fashion as registers R1-R3 in FIG. 5, and shift registers SR1R, SR2R, and SR3R correspond to the ports from which the outputs SO1, SO2, and SO3 are supplied.

Above the memory 1 as illustrated in FIG. 7, parallel output terminals of a register R3W are connected to the column connecting lines. Parallel input terminals of the register R3W, are connected to parallel output terminals of a register R2W. Parallel input terminals of the register R2W, are connected to parallel output terminals of a register R1W. To each register R1W-R3W, output terminals of a respective one of shift registers SR1W, SR2W, and SR3W are connected. Write-in data transfer from the shift registers SR1W, SR2W and SR3W to the registers R1W, R2W, and R3W is done by a parallel load signal LDW supplied to shift registers SR1W, SR2W and SR3W.

Serial write-in data SI1, SI2, and SI3 are supplied to the shift registers SR1W, SR2W, and SR3W.

For performing the write-in operation, a control signal WE is supplied from the control circuit 4 to the memory 1. The control circuit (C) 4 generates shift clocks SFTW and SFTR, as well as the parallel load signal LDW, LD1, LD2, and LD3.

In the second embodiment illustrated in FIG. 7, multiple ports for the write-in operation and multiports for the read-out operation are provided.

It will be appreciated that the number of ports is not limited to 3. Also, in place of selector 3 for selecting upper bits of an address, a structure in which plural upper bits are supplied through a bus buffer to a common bus can be employed.

The invention can provide a multiport memory suited for image processing, since the memory 1 only needs to drive one register, so that the load on the memory 1 is reduced.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A method of operating a multiport memory having a plurality of serial output ports and a semiconductor memory operative to store data in a plurality of memory elements arrayed in rows and columns and coupled by respective row and column connecting lines, comprising the steps of:

reading data stored in the plurality of memory elements via one of the row connecting lines and the column connecting lines thereof in parallel to a first register means;

storing the data read from the plurality of memory elements in the first register means;

supplying the data stored in the first register means in serial form to a first one of the serial output ports;

reading the data stored in the first register means in parallel form to second register means;

storing the data read from the first register means in the second register means; and supplying the data received by the second register means from the first register means and stored in the second register means, in serial form to a second one of the serial output ports.

2. A method of operating a multiport memory having a plurality of serial output ports and a semiconductor memory operative to store data in a plurality of memory elements arrayed in rows and columns and coupled by respective row and column connecting lines, comprising the steps of:

reading data stored in the plurality of memory elements via one of the row connecting lines and the column connecting lines thereof in parallel to a first register stage;

storing the data read from the plurality of memory elements in the first register stage;

supplying the data stored in the first register stage in parallel form to a first serial output register for storage therein;

supplying the data stored in the first serial output register in serial form to a first one of the serial output ports;

supplying the data stored in the first register stage in parallel form to a register means;

storing the data from the first register stage in the register means; and supplying the data received by the register means from the first register stage and stored in the register means, in serial form to a second one of the serial output ports.

3. The method of claim 2, wherein the step of supplying data from the first register stage in parallel form to the register means for storage therein comprises reading the data stored in the first register stage in parallel form to a second register stage of the register means, storing the data read from the first register stage in the second register stage, reading data stored in the second register stage in parallel to a second serial output register of the register means and storing the data read from the second register stage in the second serial output register; and wherein the step of supplying the data stored in the register means in serial form to the second serial output port comprises supplying the data stored in the second serial output register in serial form to the second one of the serial output ports.

4. A method of operating a multiport memory having a plurality of serial output ports and a semiconductor memory operative to store data in a plurality of memory elements arrayed in rows and columns and coupled by respective row and column connecting lines, comprising the steps of:

storing data supplied in serial form for storage in the plurality of memory elements in first and second write register means;

reading the data stored in the first and second write register means in parallel form to third and fourth write register means, respectively;

storing the data read from the first and second write register means in the third and fourth write register means, respectively;

supplying the data stored in the third and fourth write register means in parallel form to the semiconductor memory means for storing in the plurality of memory elements thereof;

reading data stored in the plurality of memory elements via one of the row connecting lines and the column connecting lines thereof in parallel to a first register means;

storing the data read from the plurality of memory elements in the first register means;

supplying the data stored in the first register means in serial form to a first one of the serial output ports;

supplying the data stored in the first register means in parallel form to second register means;

storing the data from the first register means in the second register means; and supplying the data received by the second register means from the first register means and stored in the second register means, in serial form to a second one of the serial output ports.

5. A multiport memory having a plurality of serial output ports, comprising:

semiconductor memory means for storing data in a plurality of memory elements arrayed in rows and columns and coupled by respective row and column connecting lines and for reading the stored data therefrom in parallel to one of the row connecting lines and the column connecting lines of the plurality of memory elements;

first register means for storing data read in parallel from the semiconductor memory means via the connecting lines and for supplying the data stored therein in serial form to a first one of the serial output ports, the first register means being operative to supply the data stored therein in parallel to parallel output terminals thereof;

second register means coupled with the parallel output terminals of the first register means to receive the data supplied in parallel form from the first register means for storing the received data therein, and for supplying the data stored therein to a second one of the serial output ports;

control means for supplying a read address to the semiconductor memory means for controllably selecting data to be read in parallel therefrom, the control means being operative to supply respective control signals to the first and second register means for controlling the storage of data therein and the supply of data therefrom;

first and second write register means for each storing data supplied in serial form for storage in the plurality of memory elements and operative to output the data stored therein in parallel form to a plurality of output terminals thereof; and third and fourth write register means for storing the data supplied in parallel form at the output terminals of the first and second write register means, respectively, each of the third and fourth write register means being operative to supply the data stored therein in parallel form to the semiconductor memory means for storing in the plurality of memory elements thereof.

6. A multiport memory having a plurality of serial output ports, comprising:

semiconductor memory means for storing data in a plurality of memory elements arrayed in rows and columns and coupled by respective row and column connecting lines and for reading the stored data therefrom in parallel to one of the row connecting lines and the column connecting lines;

a first register stage coupled with said one of the row the connecting lines and the column connecting lines for controllably storing the data read in parallel form from the semiconductor memory means, the first register stage being operative to supply the data stored therein in parallel form to parallel output terminals thereof;

first serial output register means coupled with the first register stage to receive the data supplied in parallel form therefrom for storing the data received from the first register stage and for supplying the data stored therein in serial form to a first one of the serial output ports;

register means coupled with the parallel output terminals of the first register stage to receive the data supplied in parallel form from the first register stage for storing the received data therein, and for supplying the data stored therein to a second one of the serial output ports; and control means for supplying a read address to the semiconductor memory means for controllably selecting data to be read in parallel therefrom, the control means being operative to supply respective control signals to the first register stage, the first serial output register means and the register means for controlling the storage of data therein and the supply of data therefrom.

7. The multiport memory of claim 6, wherein the first serial output register means comprises a shift register having a plurality of parallel input terminals coupled with the first register stage to receive the data supplied in parallel form thereby and a serial data output terminal coupled with the first one of the serial output ports.

8. The multiport memory of claim 6, wherein the register means comprises:

a second register stage coupled with the parallel output terminals of the first register stage for storing the data supplied in parallel form thereby, the second register stage being operative to supply the data stored therein in parallel form at a plurality of output terminals thereof; and second serial output register means coupled with the output terminals of the second register stage to receive the data supplied in parallel form thereby for storing the supplied data and for supplying the data stored therein in serial form to the second one of the serial output ports.

9. The multiport memory having a plurality of serial output ports, comprising:

semiconductor memory means for storing data in a plurality of memory elements arrayed in rows and columns and coupled by respective row and column connecting lines and for reading the stored data therefrom in parallel to one of the row connecting lines and the column connecting lines of the plurality of memory elements;

first register means for storing the data read in parallel from the semiconductor memory means via the connecting lines, for supplying the data stored therein in serial form to a first one of the serial output ports, and for reading the data stored therein in parallel to parallel output terminals thereof;

second register means coupled with the parallel output terminals of the first register means to receive the data read in parallel form from the first register means for storing the received data therein, and for supplying the data stored therein to a second one of the serial output ports; and control means for supplying a read address to the semiconductor memory means for controllably selecting data to be read in parallel therefrom, the control means being operative to supply respective control signals to the first and second register means for controlling the storage of data therein and the reading and supply of data therefrom.

10. The multiport memory of claim 9, further comprising random access port means for supplying data read from the semiconductor memory means.

* * * * *